(12) United States Patent
Xiao et al.

(10) Patent No.: US 9,590,031 B2
(45) Date of Patent: Mar. 7, 2017

(54) FIN-TYPE FIELD EFFECT TRANSISTOR AND MANUFACTURING METHOD THEREOF

(71) Applicant: Semiconductor Manufacturing International (Shanghai) Corporation, Shanghai (CN)

(72) Inventors: Deyuan Xiao, Shanghai (CN); Hanming Wu, Shanghai (CN); MengFeng Cai, Shanghai (CN); Shaofeng Yu, Shanghai (CN); ShiuhWuu Lee, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/622,609

(22) Filed: Feb. 13, 2015

(65) Prior Publication Data
US 2015/0279933 A1  Oct. 1, 2015

(30) Foreign Application Priority Data

Mar. 27, 2014  (CN) .......................... 2014 1 0118033

(51) Int. Cl.
*H01L 29/06* (2006.01)
*H01L 21/225* (2006.01)
(Continued)

(52) U.S. Cl.
CPC ...... *H01L 29/0638* (2013.01); *H01L 21/2252* (2013.01); *H01L 21/306* (2013.01);
(Continued)

(58) Field of Classification Search
CPC ............... H01L 21/2252; H01L 21/306; H01L 29/7854; H01L 29/105; H01L 29/66795;
(Continued)

(56) References Cited

U.S. PATENT DOCUMENTS

H001287 H * 2/1994 Zeisse ................. H01L 21/0415
257/289
5,656,844 A * 8/1997 Klein ................ H01L 29/66772
257/347

(Continued)

OTHER PUBLICATIONS

Xiao et al., "A novel GAAC FinFET transistor: device analysis, 3D TCAD simulation, and fabrication", Journal of Semiconductors, vol. 30, No. 1, Jan. 2009, pp. 014001-1 to 014001-5.

(Continued)

*Primary Examiner* — Cuong Q Nguyen
*Assistant Examiner* — Tong-Ho Kim
(74) *Attorney, Agent, or Firm* — Innovation Counsel LLP

(57) ABSTRACT

A fin-type field effect transistor includes a semiconductor body formed on a substrate, the semiconductor body having a top surface and a pair of laterally opposite sidewalls, and a gate electrode formed above the sidewalls and the top surface of the semiconductor body. The semiconductor body further includes a source region formed on an end portion of the semiconductor body, a drain region formed on another end portion of the semiconductor body, and a channel region formed between the source region and the drain region and surrounded by the gate electrode, wherein a doping concentration of the channel region decreases with increasing distance from the top surface and the sidewalls.

18 Claims, 6 Drawing Sheets

(51) Int. Cl.
*H01L 21/306* (2006.01)
*H01L 29/10* (2006.01)
*H01L 29/66* (2006.01)
*H01L 29/78* (2006.01)
*H01L 21/02* (2006.01)

(52) U.S. Cl.
CPC ...... *H01L 21/30604* (2013.01); *H01L 29/105* (2013.01); *H01L 29/66795* (2013.01); *H01L 29/7854* (2013.01); *H01L 21/02238* (2013.01)

(58) Field of Classification Search
CPC ........... H01L 29/0638; H01L 21/30604; H01L 21/02238
USPC .......................................... 257/400; 438/283
See application file for complete search history.

(56) References Cited

U.S. PATENT DOCUMENTS

| | | | | |
|---|---|---|---|---|
| 2004/0256683 | A1* | 12/2004 | Lee | H01L 21/823412 257/412 |
| 2011/0269287 | A1* | 11/2011 | Tsai | H01L 21/2254 438/306 |
| 2013/0320453 | A1* | 12/2013 | Pethe | H01L 29/7854 257/368 |

OTHER PUBLICATIONS

Jean-Pierre Colinge, et al., "Nanowire transistors without junctions", Nature Nanotechnology, vol. 5, Mar. 2010, pp. 225-229.

\* cited by examiner

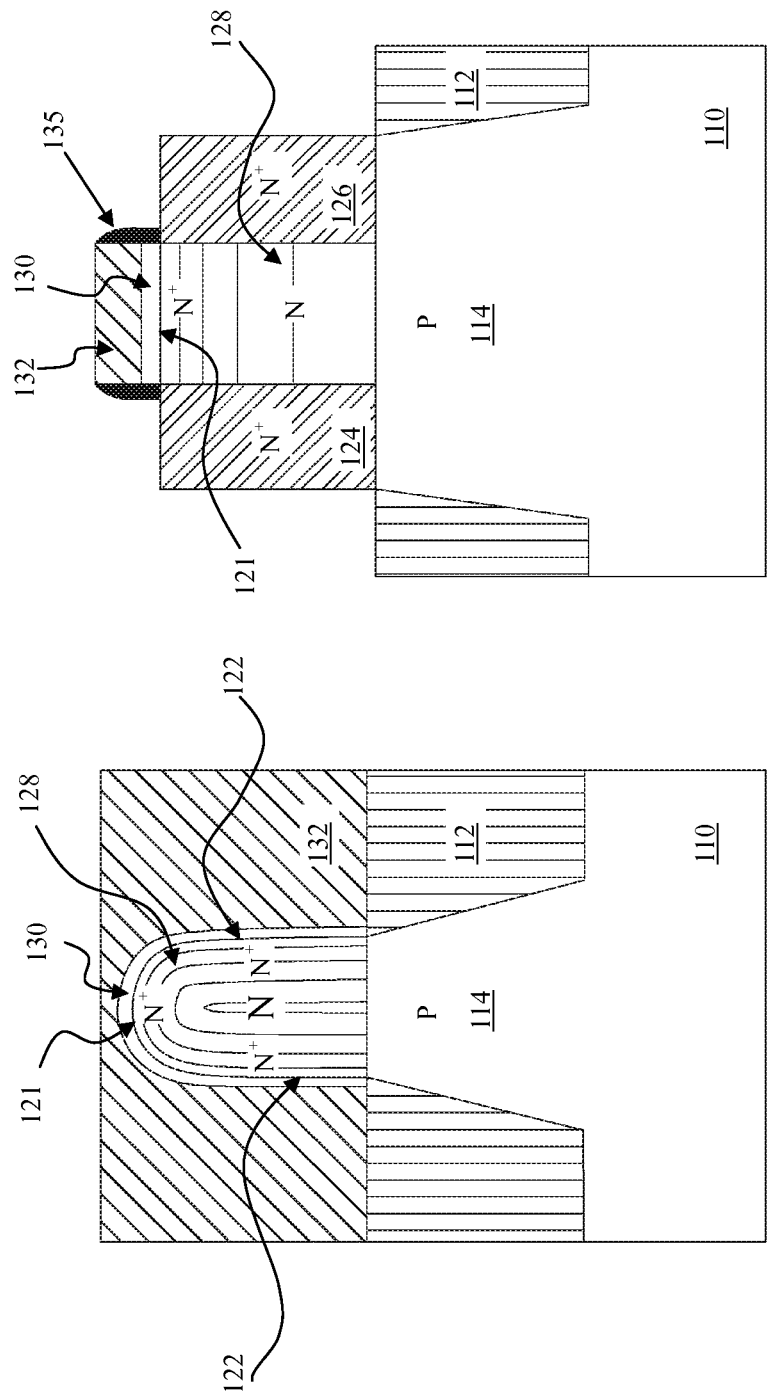

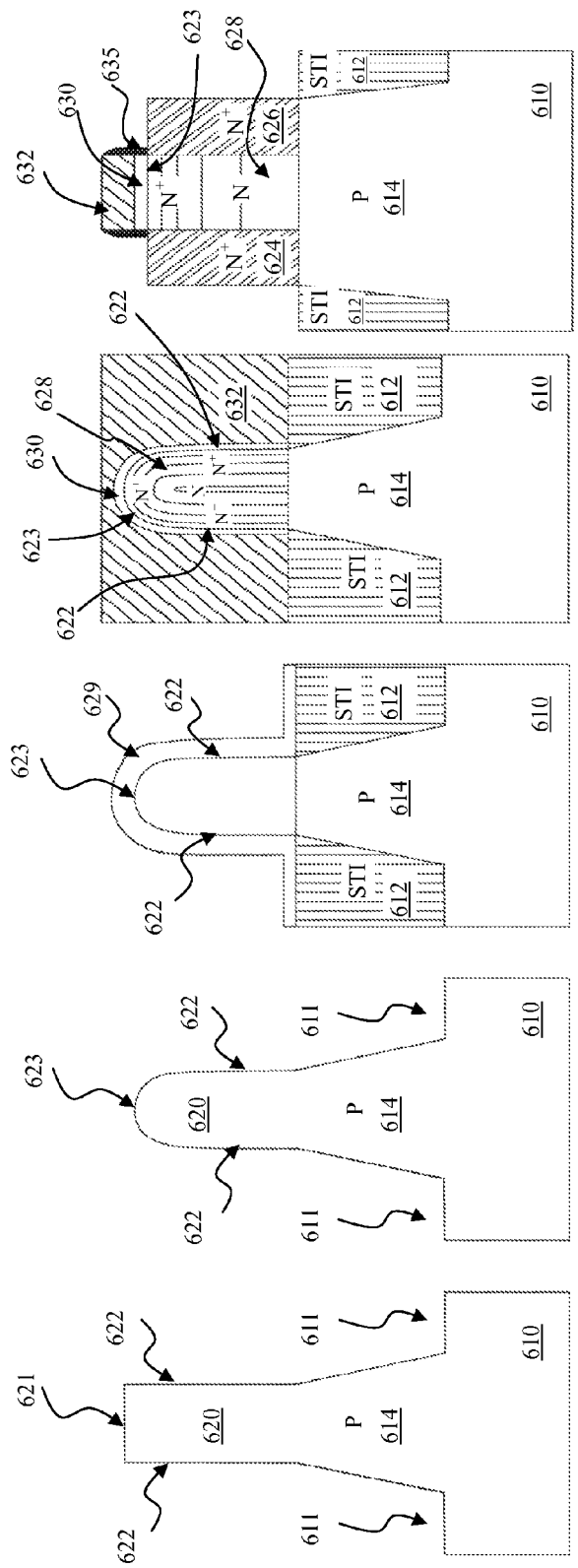

FIN-TYPE FIELD EFFECT TRANSISTOR AND MANUFACTURING METHOD THEREOF

CROSS-REFERENCE TO RELATED APPLICATION

This application claims priority to Chinese Patent Application No. 201410118033.6 filed on Mar. 27, 2014, the disclosure of which is incorporated herein by reference in its entirety.

BACKGROUND

Technical Field

The present disclosure relates to the field of semiconductor technology, and more particularly to a fin-type field effect transistor (FinFET) including a channel having a graded doping profile and a manufacturing method thereof.

Description of the Related Art

In the manufacture of integrated circuit devices, multi-gate transistors such as tri-gate transistors and the like have become increasingly prevalent as devices continue to shrink in size. In a conventional tri-gate transistor, the source and drain are heavily doped n-type regions and the channel under the gate is a lightly doped p-type region. Also, a very high doping concentration gradient may be necessary in a conventional tri-gate transistor as the distance between the junctions of the CMOS devices is reduced to 10 nm or less. The doping concentration gradient is governed by the laws of diffusion law and the statistical distribution of dopant atoms. As such, it becomes increasingly difficult to control the doping concentration gradient as the distance between junctions reduces to 10 nm or less.

SUMMARY

The present disclosure addresses at least the above challenges relating to the control of doping concentration gradient.

According to some embodiments of the inventive concept, a fin-type field effect transistor is provided. The fin-type field effect transistor includes a semiconductor body formed on a substrate, the semiconductor body having a top surface and a pair of laterally opposite sidewalls; and a gate electrode formed above the sidewalls and the top surface of the semiconductor body. The semiconductor body further includes a source region formed on an end portion of the semiconductor body, a drain region formed on another end portion of the semiconductor body, and a channel region formed between the source region and the drain region and surrounded by the gate electrode, wherein a doping concentration of the channel region decreases with increasing distance from the top surface and the sidewalls.

In some embodiments, a distribution of the doping concentration along a minimum distance from a position within the channel region to a position on a surface of the channel region may substantially follow an error function distribution or a Gaussian distribution.

In some embodiments, the substrate may include a bulk silicon substrate, and the semiconductor body may be formed on an active region of the bulk silicon substrate.

In some embodiments, the source region, the drain region, and the channel region may be of a same conductivity type.

In some embodiments, the source region and the drain region may be of a first conductivity type, and the channel region may be of a second conductivity type.

In some embodiments, the conductivity type of the source region, the drain region, and the channel region of the semiconductor body may be one of n-type and p-type, and a conductivity type of the active region of the bulk silicon substrate may be the other one of the n-type and p-type.

In some embodiments, the fin-type field effect transistor may further include a gate dielectric formed on a portion of the top surface and the sidewalls of the semiconductor body, wherein the gate electrode may be formed directly on the gate dielectric.

In some embodiments, the source region and the drain region may have a uniform doping concentration, and wherein the doping concentration in each of the source region and the drain region may be greater than or equal to a maximum doping concentration in the channel region.

In some embodiments, the top surface of the semiconductor body may have a circular arc shape.

According to some other embodiments of the inventive concept, a method of forming a fin-type field effect transistor is provided. The method includes forming a semiconductor body on a substrate, the semiconductor body having a top surface and a pair of laterally opposite sidewalls; doping the semiconductor body with an impurity, such that a doping concentration of a channel region in the semiconductor body decreases with increasing distance from the top surface and the sidewalls; forming a gate dielectric and a gate electrode on a surface of the semiconductor body; and forming a source region and a drain region adjacent to the gate electrode surrounding the channel region, on respective end portions of the semiconductor body.

In some embodiments of the method, doping the semiconductor body may include: forming a doped layer conformally on the semiconductor body; performing a high-temperature annealing so as to allow the impurity in the doped layer to diffuse into the semiconductor body; and removing the doped layer after the high-temperature annealing.

In some embodiments of the method, a distribution of the doping concentration along a minimum distance from a position within the channel region to a position on a surface of the channel region may substantially follow an error function distribution or a Gaussian distribution.

In some embodiments of the method, the substrate may include a bulk silicon substrate, and the semiconductor body may be formed on an active region of the bulk silicon substrate.

In some embodiments of the method, the source region, the drain region, and the channel region may be of a same conductivity type.

In some embodiments of the method, the source region and the drain region may be of a first conductivity type, and the channel region may be of a second conductivity type.

In some embodiments of the method, the conductivity type of the source region, the drain region, and the channel region of the semiconductor body may be one of n-type and p-type, and a conductivity type of the active region of the bulk silicon substrate may be the other one of the n-type and p-type.

In some embodiments of the method, the source region and the drain region may have a uniform doping concentration, and wherein the doping concentration in each of the source region and the drain region may be greater than or equal to a maximum doping concentration in the channel region.

In some embodiments, the method may further include performing an etching process on the top surface of the semiconductor body such that the top surface of the semiconductor body has a circular arc shape.

BRIEF DESCRIPTION OF THE DRAWINGS

The accompanying drawings, which are incorporated herein and constitute a part of the specification, illustrate different embodiments of the inventive concept and, together with the description, serve to describe more clearly the inventive concept.

It is noted that in the accompanying drawings, for convenience of description, the dimensions of the components shown may not be drawn to scale. Also, same or similar reference numbers between different drawings represent the same or similar components.

FIG. 2A is a cross-sectional view of the FinFET of FIG. 1 taken along line A-A'.

FIG. 2B is a cross-sectional view of the FinFET of FIG. 1 taken along line B-B'.

FIGS. 6A to 6E are cross-sectional views of an n-type FinFET at different stages of fabrication according to the exemplary method of FIG. 5.

DETAILED DESCRIPTION

Figure 1:
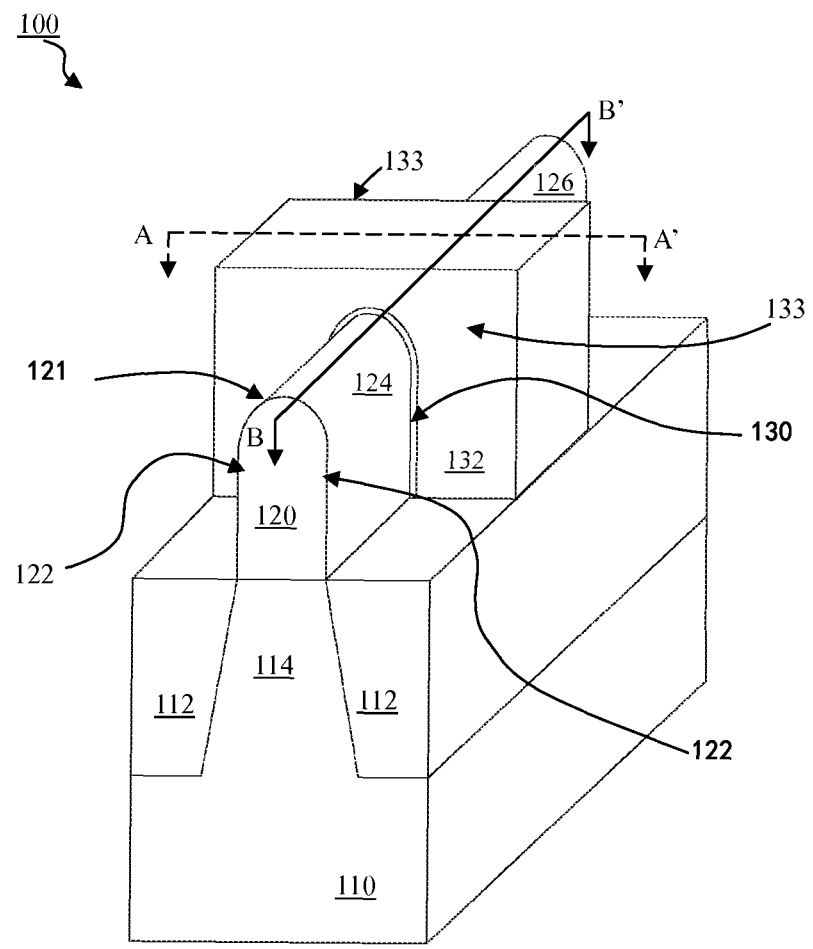
FIG. 1 depicts a FinFET including a channel having a graded doping profile according to an embodiment of the inventive concept.

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that the inventive concept is not limited to the embodiments described herein. Rather, the inventive concept may be modified in different ways to realize different embodiments.

FIG. 1 depicts a FinFET 100 including a channel having a graded doping profile according to an embodiment of the inventive concept.

Referring to FIG. 1, the FinFET 100 includes a substrate 110 and a semiconductor body 120 formed on the substrate 110. The semiconductor body 120 is formed having a top surface 121 and a pair of laterally opposite sidewalls 122. A gate dielectric 130 is formed on a portion of the top surface 121 and the sidewalls 122 of the semiconductor body 120, and a gate electrode 132 is formed directly on the gate dielectric 130.

The substrate 110 may be, for example, a bulk silicon substrate. In some embodiments (not shown), the substrate 110 may be a conventional silicon-on-insulator (SOI) substrate. A pair of isolation regions 112 may be formed in the substrate 110. The isolation regions 112 may be formed as shallow trench isolation (STI) regions. An active region 114 is formed between the pair of isolation regions 112.

As shown in FIG. 1, the semiconductor body 120 may be formed on the active region 114. In an n-type device, the active region 114 is typically doped with a p-type dopant to a conductivity level (concentration) of about $1 \times 10^{16}$ to about $1 \times 10^{19}$ atoms/cm$^3$. Similarly, in a p-type device, the active region 114 is typically doped with an n-type dopant to a conductivity level (concentration) of about $1 \times 10^{16}$ to about $1 \times 10^{19}$ atoms/cm$^3$. In some alternative embodiments, the active region 114 may be undoped.

As previously described, the semiconductor body 120 is formed having the top surface 121 and the pair of laterally opposite sidewalls 122. The pair of laterally opposite sidewalls 122 are substantially perpendicular to a surface of the substrate 110. In some embodiments, the top surface 121 may be substantially planar. In some other embodiments, the top surface 121 may be curved. For example, a portion of the top surface 121 may have a circular arc, such as a semi-circular or oval shape.

In some preferred embodiments, the top surface 121 may have a semi-circular shape (for example, as shown in FIG. 2A which depicts a cross-sectional view taken along line A-A' of FIG. 1). In some alternative embodiments, the top surface 121 may be substantially flat, while the surfaces of the laterally opposite sidewalls 122 may be arc-shaped.

A height of the semiconductor body 120 is defined as $H_{fin}$. The height $H_{fin}$ is measured from a highest point of the top surface 121 to a top surface of the active region 114 on the substrate 110. A width of the semiconductor body 120 is defined as $W_{fin}$. The width $W_{fin}$ is measured as the average distance between the pair of laterally opposite sidewalls 122. In some preferred embodiments, the height $H_{fin}$ of the semiconductor body 120 is about 20 nm±5 nm, and the width $W_{fin}$ of the semiconductor body 120 is about 20 nm±5 nm.

The semiconductor body 120 includes a source region 124, a drain region 126, and a channel region 128. The source region 124 is formed on an end portion of the semiconductor body 120, and the drain region 126 is formed on another end portion of the semiconductor body 120. The channel region 128 is formed between the source region 124 and the drain region 126, and is surrounded by the gate electrode 132 (see FIGS. 2A and 2B). In some embodiments, the positions of the source region 124 and the drain region 126 may be switched.

The semiconductor body 120 may include silicon (Si), germanium (Ge), silicon germanium (Si$_x$Ge$_y$), gallium arsenide (GaAs), indium antimonide (InSb), gallium phosphide (GaP), gallium antimonide (GaSb), indium gallium arsenide (InGaAs), or other Group III/V or Group II/VI compound semiconductors. The source region 124, the drain region 126, and the channel region 128 may be doped of the same conductivity type. In an n-type device, the source region 124, the drain region 126, and the channel region 128 are doped with an n-type dopant. In a p-type device, the source region 124, the drain region 126, and the channel region 128 are doped with a p-type dopant. Accordingly, a junctionless FinFET 100 is formed using the above doping configuration.

The gate dielectric 130 may be formed on a portion of the top surface 121 and the sidewalls 122 of the semiconductor body 120. The gate electrode 132 is formed adjacent to the gate dielectric 130, for example, as shown in FIG. 1. In the embodiment of FIG. 1, the FinFET 100 is formed having a tri-gate structure, but is not limited thereto. In some other embodiments, the FinFET 100 may be formed having a double-gate, $\Omega$-gate, or $\pi$-gate structure. In some further embodiments, the FinFET 100 may be formed having a cylindrical wrap-around shape.

The gate dielectric 130 and the gate electrode 132 may be formed using conventional semiconductor materials. For example, the gate dielectric 130 may be formed of silicon oxide or silicon nitride. In some other embodiments, the gate dielectric 130 may be formed of hafnium oxide, zirconium oxide, lanthanum oxide, aluminum oxide, titanium oxide, a strontium titanium compound, an aluminum compound comprising lanthanum, yttrium oxide, or mixtures thereof, or a high-k dielectric material formed of silicate or the like, or a combination of any of the above materials.

The gate electrode 132 may include a semiconductor (e.g., polysilicon) gate electrode layer or a metal gate layer. In some embodiments, the gate dielectric 130 may be formed of a conventional dielectric material and the gate electrode 132 may be formed as a semiconductor gate layer. In some alternative embodiments, the gate dielectric 130 may be formed of a high-k dielectric material and the gate electrode 132 may be formed of a conductive refractory metal nitride (e.g., tantalum nitride, titanium nitride, tungsten nitride, titanium aluminum nitride, triaza-cyclononane (triazacyclononane), or a mixture thereof) of a metal gate layer. In some further alternative embodiments, a gate stack may include a metal gate electrode 132 and a semiconductor gate electrode.

The gate electrode 132 has a pair of laterally opposite sidewalls 133 extending substantially vertically between opposite sidewalls 122 in the lateral direction of the semiconductor body 120.

A gate length (Lg) is defined as an average distance between the pair of laterally opposite sidewalls 133. The gate length Lg typically ranges between 2 nm to 50 nm, preferably less than 10 nm. A typical (approximately uniform) thickness of the gate dielectric 130 may range between 1 nm to 3 nm.

According to an embodiment of the inventive concept, spacers are formed on the pair of laterally opposite sidewalls 133 adjacent to the gate electrode 132. For example, FIG. 2B illustrates a spacer 135. However, spacers have been omitted from the structure of FIG. 1 in the interest of clarity, and to avoid obscuring other elements of the inventive concept.

FIGS. 2A and 2B are cross-sectional views of the FinFET 100 of FIG. 1 taken along lines A-A' and line B-B', respectively. Specifically, FIGS. 2A and 2B illustrate an n-type FinFET 100. Nevertheless, it should be noted that a p-type FinFET 100 may be formed having a similar structure.

Referring to FIGS. 2A and 2B, the impurity doping concentration in the channel region 128 has a graded doping profile. Specifically, the doping concentration within the channel region 128 is higher in a region on/near the top surface 121 and the sidewalls 122, compared to regions located further away from the top surface 121 and the sidewalls 122. In some embodiments, the doping concentration in the region on/near the top surface 121 and the sidewalls 122 ranges from about $1 \times 10^{19}$ to about $5 \times 10^{19}$ atoms/cm$^3$. In contrast, the regions located further away from the top surface 121 and the sidewalls 122 (e.g., a central region of the channel region 128 between the two sidewalls 122 in FIG. 2A, or a lower region of the channel region 128 in FIG. 2B) may have a doping concentration ranging from $1 \times 10^{16}$ to about $5 \times 10^{16}$ atoms/cm$^3$. In some preferred embodiments, the doping concentration in a region on/near an inner surface of the channel region 128 is greater than or equal to about $2 \times 10^{19}$ atoms/cm$^3$.

According to the inventive concept, the distribution of the doping concentration along a minimum distance from a position within the channel region 128 to a position on the surface of the channel region 128 substantially follows an error function distribution or a Gaussian distribution. Here, the minimum distance from the position within the channel region 128 to the position on the surface of the channel region 128 may correspond to a smallest vertical distance measured from the position within the channel region 128 to a surface comprising the top surface 121 and the two sidewalls 122.

As described in greater detail below, the gradient of the channel doping profile in the channel region 128 is a result of diffusion occurring after a doped layer has been formed (i.e., the doped layer acting as a constant diffusion source), and substantially follows an error function distribution. However, in the case of ion implantation, the gradient of the channel doping profile in the channel region 128 substantially follows a Gaussian distribution profile since the source is diffusion limited.

Figure 3A:
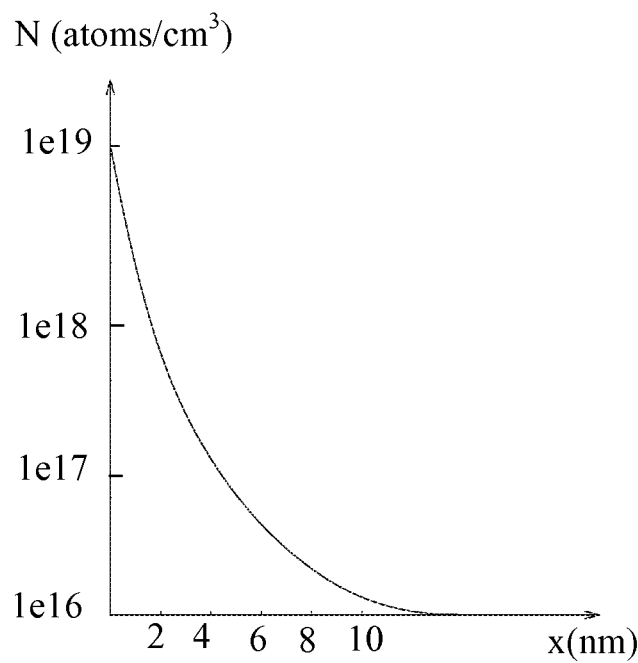
FIG. 3A depicts the doping concentration (N) of the channel region with respect to a minimum distance (x) to a surface of the semiconductor body for an error function distribution.
Figure 3B:
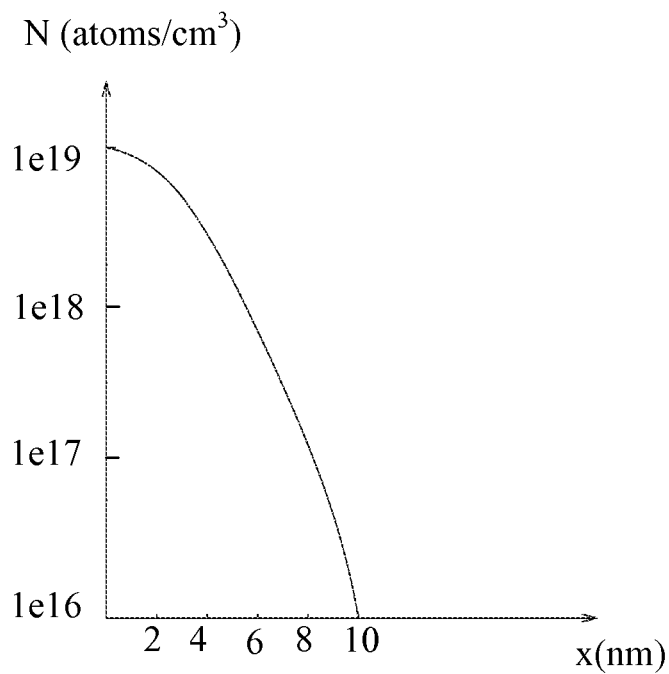
FIG. 3B depicts the doping concentration (N) of the channel region with respect to a minimum distance (x) to a surface of the semiconductor body for a Gaussian distribution.

FIG. 3A depicts the doping concentration (N) of the channel region 128 with respect to a minimum distance (x) to a surface of the semiconductor body for an error function distribution. FIG. 3B depicts the doping concentration (N) of the channel region 128 with respect to a minimum distance (x) to a surface of the semiconductor body for a Gaussian distribution.

Referring to FIGS. 3A and 3B, the horizontal axis represents a minimum distance (x) from a position within the channel region 128 to the surface of the channel region 128, and the vertical axis represents the doping concentration (N) in the channel region 128. It should be noted that FIGS. 3A and 3B are merely illustrative and do not limit the scope of the inventive concept. It should also be noted that the curves shown in FIGS. 3A and 3B represent ideal channel doping concentration profiles, and that the channel doping concentration profiles in actual FinFET devices may vary due to variations in manufacturing processes. Nevertheless, the dopant concentration distribution within the channel in FinFET devices fabricated according to the inventive concept should substantially conform to the curve distribution profiles illustrated in FIGS. 3A and 3B.

As shown in FIG. 2B, the channel region 128, the source region 124, and the drain region 126 are of the same dopant type (i.e., n-type). Further, the source region 124 and the drain region 126 have a uniform doping concentration. In some embodiments, the doping concentration in each of the source region 124 and the drain region 126 may be greater than or equal to the maximum doping concentration in the channel region 128. For example, the doping concentrations in each of the source region 124 and the drain region 126 may be greater than or equal to $5 \times 10^{19}$ atoms/cm$^3$, and less than or equal to $1 \times 10^{21}$ atoms/cm$^3$. In some instances (depending on specific device needs), the doping concentration in each of the source region 124 and the drain region 126 may be equal (or unequal).

Figure 4:
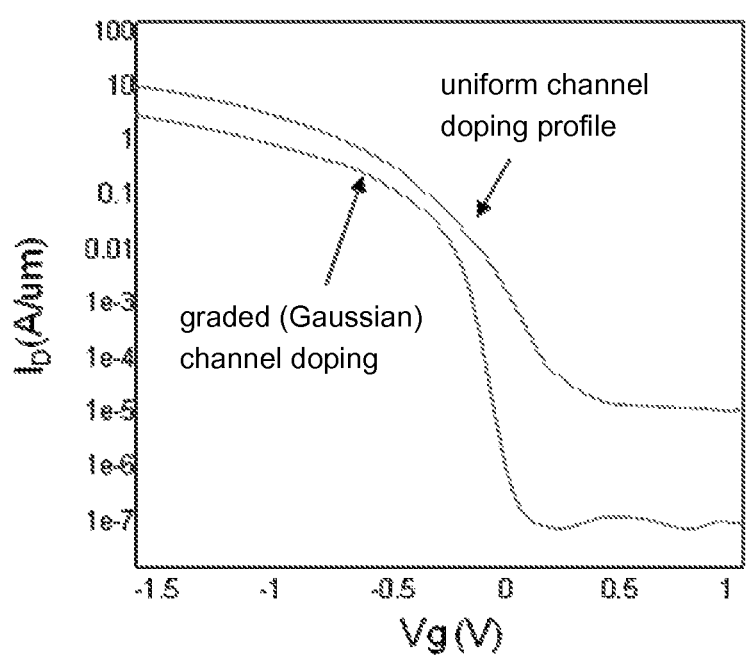
FIG. 4 illustrates a simulation result of the switching characteristics of the FinFET of FIG. 1.

FIG. 4 illustrates a simulation result of the switching characteristics of the FinFET 100 of FIG. 1. In the example of FIG. 4, the FinFET 100 is an n-type FinFET. The simulation conditions are as follows: the height $H_{fin}$ of the semiconductor body 120 is about 20 nm; the width $W_{fin}$ of the semiconductor body 120 is about 20 nm; the thickness of the gate dielectric 130 is about 2 nm; and the gate length Lg is about 10 nm.

In the case of a uniform channel doping profile, the channel region 128 has a uniform doping concentration of about $5 \times 10^{19}$ atoms/cm$^3$.

In the case where the channel doping profile has a gradient, the doping concentration in a region on/near the surface of the channel region 128 is about $5 \times 10^{19}$ atoms/cm$^3$, and the doping concentration in a region located further away from the surface of the channel region 128 is about $1 \times 10^{16}$ atoms/cm$^3$, and the channel region 128 substantially follows a Gaussian distribution profile.

Referring to the simulation results in FIG. 4, the horizontal axis represents the gate voltage (Vg) and the vertical axis represents the drain current ($I_D$). The upper curve in FIG. 4 depicts a uniform channel doping profile, while the lower curve in FIG. 4 depicts a graded channel doping profile. As shown in FIG. 4, by using a graded channel doping profile that approximately follows a Gaussian distribution profile, the FinFET 100 exhibits improved on-off drain current ratio. In some embodiments, the on-off drain current ratio has a magnitude of about $10^5$. Accordingly, the FinFET 100 exhibits improved switching characteristics. Since the doping concentration is reduced in regions that are located further away from the surface of the semiconductor body 120, the electrical conductivity of those regions is also reduced. As a result, the leakage current flowing through those regions can be mitigated when the device is turned off.

In some embodiments of the inventive concept, the source region 124, the drain region 126, and the channel region 128 of the FinFET 100 are doped of a same conductivity type (n-type as shown in FIGS. 2A and 2B), so as to form a junctionless FinFET 100. It should be noted that the junctionless FinFET 100 does not have a PN junction.

Advantages of the FinFET 100 also include the following. By fabricating the FinFET 100 on a bulk silicon substrate, production costs can be reduced (compared to fabricating the FinFET 100 on a conventional SOI substrate). In addition, when the doping concentration in each of the source region 124 and the drain region 126 of the FinFET 100 is greater than or equal to the maximum doping concentration of the channel region 128, the contact resistance between the source region 124 and the drain region 126 can be reduced, thereby further improving the performance of the FinFET 100.

In some embodiments, the top surface of the channel region 128 of the FinFET 100 may be shaped as a circular arc (for example, as shown by the semicircular cross-section of the FinFET 100 taken along line A-A' of FIG. 1). The circular arc shape helps to uniformly distribute the impurities in a region on/near the top surface of the channel region 128, which allows a uniform electric field to be applied in the region near the top surface of the channel region 128, thereby further improving the performance of the FinFET 100.

Figure 5:
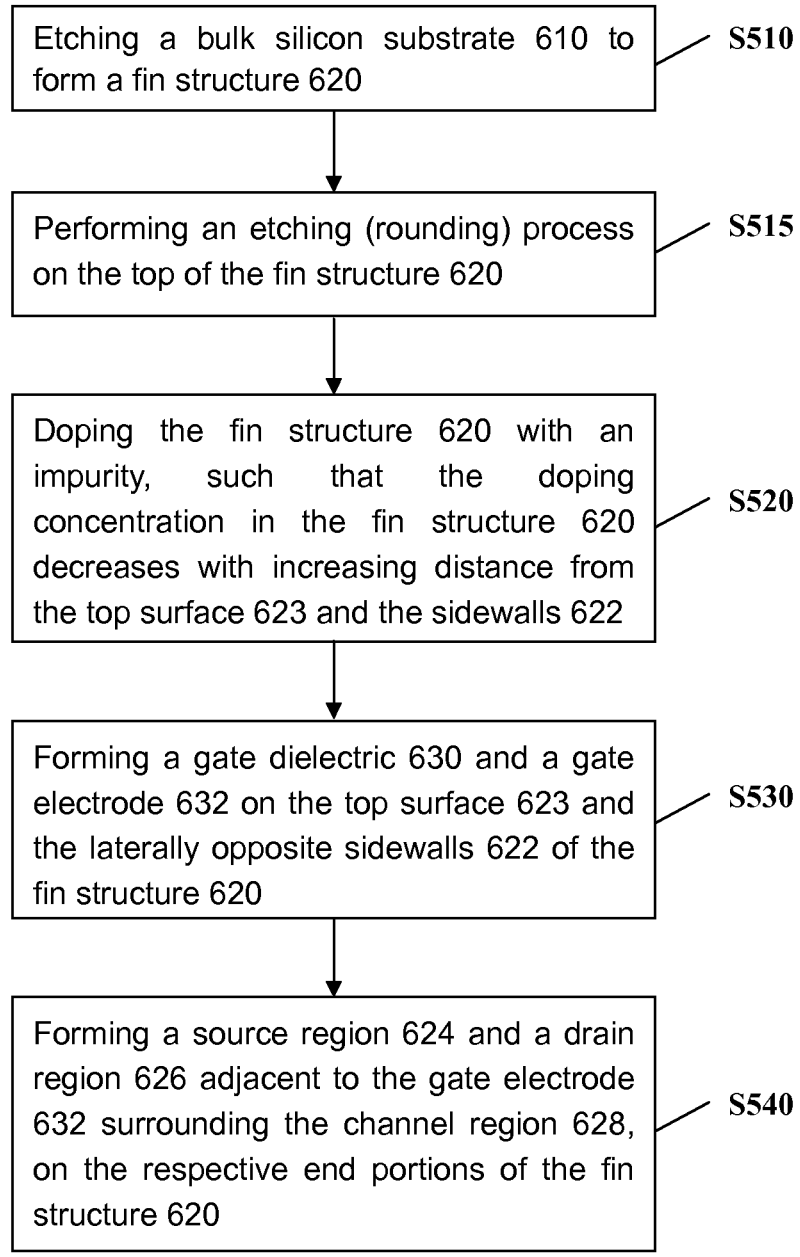
FIG. 5 is a flowchart of an exemplary method of forming an n-type FinFET according to an embodiment of the inventive concept.

FIG. 5 is a flowchart of an exemplary method 500 of forming an n-type FinFET 100 according to an embodiment of the inventive concept. It should be appreciated by those skilled in the art that a p-type FinFET 100 may be formed using a method similar to that of method 500. FIGS. 6A to 6E are cross-sectional views of the n-type FinFET 100 at different stages of fabrication according to the exemplary method of FIG. 5.

Referring to FIG. 5, a bulk silicon substrate 610 is first etched to form a fin structure 620 (Step S510), whereby the fin structure 620 has a flat top surface 621 and a pair of laterally opposite sidewalls 622. The pair of laterally opposite sidewalls 622 may be substantially perpendicular to a surface of the bulk silicon substrate 610. In some embodiments, the fin structure 620 is formed having a height of 20 nm±5 nm and a width of 20 nm±5 nm. The bulk silicon substrate 610 is etched using conventional semiconductor fabrication processes, such as a wet etching process (using, for example, NH$_4$OH) or a dry etching process (using, for example, HBrCl).

In addition, an STI etch (for example, using a conventional STI trench etch process) may be carried out to form a trench opening 611. The trench opening 611 is etched to a sufficient depth so as to isolate adjacent transistors from each other. In some embodiments, the trench opening 611 is etched to a depth of about 20 nm±10 nm.

In forming an n-type device, an active region 614 is defined by the trench opening 611 (as shown in FIG. 6A). The active region 614 is doped with a p-type dopant, and the dopant concentration may range from about $1 \times 10^{16}$ to about $1 \times 10^{19}$ atoms/cm$^3$. The doping of the active region 614 may be carried out using a conventional doping process.

FIG. 6A illustrates a cross-sectional view of the resulting structure after Step S510. In particular, FIG. 6A illustrates the fin structure 620, the trench opening 611, and the doped active region 614.

Next, the top of the fin structure 620 undergoes an etching (rounding) process to form a substantially cylindrical curved top surface 623 (Step S515). The etching (rounding) process may include repeated cycles of oxidation and dilute hydrofluoric acid (DHF) wet etching, and performing hydrogen annealing at a temperature of about 800° C. to 1200° for about 5 minutes to 30 minutes. FIG. 6B shows a cross-sectional view of the resulting structure after the etching (rounding) process, which is consistent with the cross-sectional view taken along line A-A' of FIG. 1.

Next, an STI material 612 is deposited in the trench opening 611 and around the fin structure 620. In some embodiments (not shown), a thickness of the STI material 612 may be greater than the height of the fin structure 620. The STI material 612 is an insulating material, such as a dielectric material. For example, the STI material 612 may include silicon dioxide, fluorinated silicon oxide (SiOF), or any other suitable STI materials. The STI material 612 may be deposited using chemical vapor deposition process (CVD), physical vapor deposition (PVD), atomic layer deposition (ALD), or other appropriate deposition processes.

Next, the deposited STI material 612 can be polished back using, for example, conventional grinding processes. For example, an STI etch-back may be performed to expose the top surface 623 and the sidewalls 622 of the fin structure 620, and to level the top surfaces of the STI material 612 and the active region 614 (as shown in FIG. 6C). The exposed fin structure 620 constitutes the main semiconductor body of the FinFET 100. The STI etch-back may be carried out using conventional etch processes, such as wet etching (using, for example, HF) or dry etching (using, for example, CHF$_3$, CH$_3$F, or CF$_4$).

Next, the fin structure 620 is doped with an impurity (Step S520), such that the doping concentration in the fin structure 620 decreases with increasing distance from the top surface 623 and the sidewalls 622. In other words, the doping concentration is higher at the top surface 623 and the sidewalls 622 compared to the inner regions of the fin structure 620.

In some embodiments, to realize Step S520, a doped layer 629 is first formed on the fin structure 620, and on the STI material 612 on the bulk silicon substrate 610, as shown in FIG. 6C. Specifically, FIG. 6C shows a cross-sectional view of the resulting structure after the doped layer 629 is formed. The doped layer 629 may be deposited on the fin structure 620 and the STI material 612 using conventional doping processes such as CVD, PVD, or ALD.

In an n-type device, the doped layer 629 may be a phosphosilicate glass (PSG) layer with a phosphorus content of about 4% to 8% (atomic weight). Conversely, in a p-type device, the doped layer 629 may be a borosilicate glass (BSG) layer with a boron content of about 4% to 8% (atomic weight). Alternatively, the doped layer 629 may phosphorous-doped polysilicon or boron-doped polysilicon, with a doping concentration ranging between about $1 \times 10^{18}$ to $2 \times 10^{21}$ atoms/cm$^3$.

Alternatively, the doped layer 629 may be SiO$_2$ or polysilicon doped with other pentavalent impurities (such as arsenic or antimony) or trivalent impurities (such as aluminum, gallium, or indium). It should be noted the materials in the doped layer 629 listed above are merely exemplary, and that other suitable alternative materials may be used for the doped layer 629.

Next, the doped layer 629 is subject to high temperatures to allow the impurities in the doped layer 629 to diffuse into the fin structure 620. For example, high-temperature diffusion annealing may be performed at about 700° C. to 1200° C. for about 30 minutes to 600 minutes. It should be understood that the temperature and time parameters are not limited thereto, but may vary depending on the size and materials of the components in the FinFET 100 and device performance/cost requirements.

After a graded doping profile has been formed in the fin structure 620, etching is performed to remove the doped layer 629. Accordingly, the fin structure 620 is formed having a graded doping profile, whereby the distribution of the doping concentration along a minimum distance from a position within the fin structure 620 to a position on the surface of the fin structure 620 substantially follows an error function distribution (see FIG. 3A).

In some alternative embodiments, an oblique angle ion implantation process (not shown) may be carried out to achieve the doping in Step S520. The oblique angle ion implantation method may include performing ion implantation on the fin structure 620 (i.e., the semiconductor body) at a tilt angle, followed by high temperature annealing (for diffusion). The tilt angle refers to the angle of inclination at which ions are directed towards the surface of the fin structure 620.

For example, in n-type doping, As$^+$ ions can be implanted with an energy of about 500 ev to 5 kev, an ion dosage of about $1 \times 10^{15}$ to $5 \times 10^{15}$ ions/cm$^2$, an inclination angle of about 5 degrees to 30 degrees, with the ion implantation performed while the wafer is rotating. Next, a high temperature diffusion anneal is carried out at about 700° C. to 1200° C. for about 30 to 600 minutes.

Similarly, in p-type doping, BF$_2$$^+$ ions can be implanted with an energy of about 500 ev to 2 kev, an ion dosage of about $1 \times 10^{15}$ to $5 \times 10^{15}$ ions/cm$^2$, an inclination angle of about 5 degrees to 30 degrees, with the ion implantation performed while the wafer is rotating. Next, a high temperature diffusion anneal is carried out at about 700° C. to 1200° C. for about 30 to 600 minutes.

Accordingly, the fin structure 620 is formed having a graded doping profile, whereby the distribution of the doping concentration along a minimum distance from a position within the fin structure 620 to a position on the surface of the fin structure 620 substantially follows a Gaussian distribution (see FIG. 3B).

It should be noted that the types of impurity ions and ion implantation conditions described above are merely exemplary, and that other suitable impurity ions and ion implantation conditions may be used. For example, in addition to miter ion implantation, other ion implantation methods (such as plasma doping) may be used to achieve a graded doping profile in the channel.

Next, a gate dielectric 630 and a gate electrode 632 are formed on the top surface 623 and the laterally opposite sidewalls 622 of the fin structure 620 (Step S530). Specifically, a stack comprising a gate dielectric layer and a gate electrode layer may be formed near the top surface 623 and the laterally opposite sidewalls 622 of the fin structure 620, and the stack is then patterned and etched to form the gate dielectric 630 and the gate electrode 632. In some embodiments, the gate dielectric 630 and the gate electrode 632 may be formed using CVD. In addition, a spacer 635 is formed on the respective sidewalls of the gate dielectric 630 and the gate electrode 632.

Next, a source region 624 and a drain region 626 are formed adjacent to the gate electrode 632 surrounding the channel region 628, on the respective end portions of the fin structure 620 (Step S540).

In an n-type FinFET 100, the source region 624 and the drain region 626 are uniformly doped with an n-type dopant. The doping concentration in each of the source region 624 and the drain region 626 is greater than or equal to the maximum doping concentration of the channel region 628, so as to reduce the contact resistance of the source region 624 and drain region 626. A uniform doping concentration in the source region 624 and the drain region 626 may be achieved using conventional doping processes (such as ion implantation or plasma doping) followed by subsequent annealing. FIG. 6D is a cross-sectional view taken along line A-A' of FIG. 1, and FIG. 6E is a cross-sectional view of the source region 624 and the drain region 626 taken along line B-B' of FIG. 1.

Next, electrical contacts are formed on the gate electrode 632, the source region 624, and the drain region 626 using conventional semiconductor processes. It should be noted that other semiconductor processes may be performed so as to form a complete n-type FinFET.

In order to avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and do not limit the scope of the inventive concept. Furthermore, those skilled in the art would appreciate that various modifications can be made to the different embodiments without departing from the scope of the inventive concept.

What is claimed is:

1. A fin-type field effect transistor comprising:
a semiconductor body formed on a substrate, the semiconductor body having a top surface and a pair of laterally opposite sidewalls; and
a gate electrode formed above the sidewalls and the top surface of a channel region of the semiconductor body,
wherein the semiconductor body further comprises:
a source region formed on a first end portion of the semiconductor body and a drain region formed on a second end portion of the semiconductor body, wherein the channel region is disposed between the source region and the drain region and surrounded by the gate electrode,
wherein the channel region has a gradient doping profile having a doping concentration of the channel region decreasing with an increasing distance from the top surface and the sidewalls,
wherein the source region and the drain region have a uniform doping concentration,
wherein a first doping concentration of the channel region in a region on/near the top surface and the sidewalls ranges from about $1\times10^{19}$ to about $5\times10^{19}$ atoms/cm$^3$, and the first doping concentration of the channel region is equal to or less than the uniform doping concentration of the source region and the drain region, and
wherein a second doping concentration of the channel region in a central region between the sidewalls or a lower region of the channel region ranges from $1\times10^{16}$ to about $5\times10^{16}$ atoms/cm$^3$, and
wherein the gradient doping profile provides an on-off drain current ratio having a magnitude of about $10^5$.

2. The fin-type field effect transistor of claim 1, wherein a distribution of the doping concentration along a minimum distance from a position within the channel region to a position on a surface of the channel region substantially follows an error function distribution or a Gaussian distribution.

3. The fin-type field effect transistor of claim 1, wherein the substrate comprises a bulk silicon substrate, and the semiconductor body is formed on an active region of the bulk silicon substrate.

4. The fin-type field effect transistor of claim 3, wherein the source region, the drain region, and the channel region are of a same conductivity type.

5. The fin-type field effect transistor of claim 4, wherein:
the conductivity type of the source region, the drain region, and the channel region of the semiconductor body are one of n-type and p-type, and
a conductivity type of the active region of the bulk silicon substrate is the other one of the n-type and p-type.

6. The fin-type field effect transistor of claim 3, wherein the source region and the drain region are of a first conductivity type, and the channel region is of a second conductivity type.

7. The fin-type field effect transistor of claim 1, further comprising:
a gate dielectric formed on a portion of the top surface and the sidewalls of the semiconductor body, wherein the gate electrode is formed directly on the gate dielectric.

8. The fin-type field effect transistor of claim 1, wherein the doping concentration in each of the source region and the drain region is greater than or equal to a maximum doping concentration in the channel region.

9. The fin-type field effect transistor of claim 1, wherein the top surface of the semiconductor body has a circular arc shape.

10. A method of forming a fin-type field effect transistor, comprising:
forming a semiconductor body on a substrate, the semiconductor body having a top surface and a pair of laterally opposite sidewalls;
selectively doping the semiconductor body with an impurity in a channel region of the semiconductor body to form a gradient doping profile having a doping concentration of the channel region of the semiconductor body that decreases with an increasing distance from the top surface and the sidewalls;
forming a gate dielectric and a gate electrode on a surface of the semiconductor body in the channel region; and
forming a source region and a drain region adjacent to the gate electrode surrounding the channel region, on respective end portions of the semiconductor body,
wherein the source region and the drain region have a uniform doping concentration,
wherein a first doping concentration of the channel region in a region on/near the top surface and the sidewalls ranges from about $1\times10^{19}$ to about $5\times10^{19}$ atoms/cm$^3$, and the first doping concentration of the channel region is equal to or less than the uniform doping concentration of the source region and the drain region,
wherein a second doping concentration of the channel region in a central region between the sidewalls or a lower region of the channel region ranges from $1\times10^{16}$ to about $5\times10^{16}$ atoms/cm$^3$, and
wherein a gradient doping profile provides an on-off drain current ratio having a magnitude of about $10^5$.

11. The method of claim 10, wherein doping the semiconductor body comprises:
forming a doped layer conformally on the semiconductor body;
performing a high-temperature annealing so as to allow the impurity in the doped layer to diffuse into the semiconductor body; and
removing the doped layer after the high-temperature annealing.

12. The method of claim 10, wherein a distribution of the doping concentration along a minimum distance from a position within the channel region to a position on a surface of the channel region substantially follows an error function distribution or a Gaussian distribution.

13. The method of claim 10, wherein the substrate comprises a bulk silicon substrate, and the semiconductor body is formed on an active region of the bulk silicon substrate.

14. The method of claim 13, wherein the source region, the drain region, and the channel region are of a same conductivity type.

15. The method of claim 14, wherein:
the conductivity type of the source region, the drain region, and the channel region of the semiconductor body are one of n-type and p-type, and
a conductivity type of the active region of the bulk silicon substrate is the other one of the n-type and p-type.

16. The method of claim 13, wherein the source region and the drain region are of a first conductivity type, and the channel region is of a second conductivity type.

17. The method of claim 10, wherein the doping concentration in each of the source region and the drain region is greater than or equal to a maximum doping concentration in the channel region.

18. The method according to claim 10, further comprising:
    performing an etching process on the top surface of the semiconductor body such that the top surface of the semiconductor body has a circular arc shape.

* * * * *